United States Patent
Shibata

(10) Patent No.: US 11,776,584 B2
(45) Date of Patent: Oct. 3, 2023

(54) BANK AND CHANNEL STRUCTURE OF STACKED SEMICONDUCTOR DEVICE

(71) Applicant: Micron Technology, Inc., Boise, ID (US)

(72) Inventor: Kayoko Shibata, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 17/222,353

(22) Filed: Apr. 5, 2021

(65) Prior Publication Data

US 2021/0225413 A1    Jul. 22, 2021

Related U.S. Application Data

(62) Division of application No. 16/051,445, filed on Jul. 31, 2018, now Pat. No. 11,004,477.

(51) Int. Cl.
*G11C 11/4074*        (2006.01)
*G11C 5/06*            (2006.01)
(Continued)

(52) U.S. Cl.
CPC ............... *G11C 5/063* (2013.01); *G11C 5/14* (2013.01); *G11C 11/4072* (2013.01);
(Continued)

(58) Field of Classification Search
CPC ....... G11C 5/063; G11C 5/14; G11C 11/4072; G11C 11/4074; G11C 5/04; G11C 5/066;
(Continued)

(56) References Cited

U.S. PATENT DOCUMENTS 7,558,096 B2 *    7/2009    Ikeda ..................... G11C 5/025
                                                      365/230.03
10,224,080 B2 *   3/2019    Funaki .................... G11C 7/22
(Continued)

FOREIGN PATENT DOCUMENTS

TW        201812598 A      4/2018
WO        2020028005 A1    2/2020

OTHER PUBLICATIONS

International Preliminary Report on Patentability for PCT Application No. PCT/US2019/041449, dated Feb. 2, 2021.
(Continued)

*Primary Examiner* — Khamdan N. Alrobaie
(74) *Attorney, Agent, or Firm* — Dorsey & Whitney LLP

(57) ABSTRACT

Apparatuses for supplying power to a plurality of memory core chips are described. An example apparatus includes: a substrate, an interface chip on the substrate, and a plurality of memory core chips on the interface chip coupled to the interface chip via a plurality of electrodes. The plurality of memory core chips includes a first memory core chip, a second memory core chip, and a third memory core chip disposed between the second memory core chip and the interface chip. The first memory core chip and the third memory core chip are activated for data access while the (Continued)

second memory core chip disposed between the first memory core chip and the third memory core chip is deactivated for data access.

21 Claims, 12 Drawing Sheets

(51) Int. Cl.
*H01L 25/065* (2023.01)
*G11C 5/14* (2006.01)
*G11C 11/4072* (2006.01)
*H01L 27/06* (2006.01)
*H10B 12/00* (2023.01)

(52) U.S. Cl.
CPC ...... *G11C 11/4074* (2013.01); *H01L 25/0657* (2013.01); *H01L 27/0688* (2013.01); *H10B 12/50* (2023.02); *H01L 2225/06541* (2013.01)

(58) Field of Classification Search
CPC ... G11C 8/12; H01L 25/0657; H01L 27/0688; H01L 27/10897; H01L 2225/06541; H01L 24/16; H01L 24/17; H01L 24/81; H01L 25/0652; H01L 25/18; H01L 2224/13025; H01L 2224/16146; H01L 2224/16227; H01L 2224/16235; H01L 2224/17181; H01L 2224/81193; H01L 2225/06513; H01L 2225/06517; H01L 2225/06565; H01L 2924/15192; H01L 2924/15311; H01L 2924/16251
See application file for complete search history.

(56) References Cited

U.S. PATENT DOCUMENTS

| | | | |
|---|---|---|---|
| 2007/0194455 A1* | 8/2007 | Ikeda | H01L 25/0657 257/777 |
| 2011/0026293 A1* | 2/2011 | Riho | H01L 25/18 365/63 |
| 2012/0092943 A1 | 4/2012 | Nishioka | |
| 2012/0195148 A1 | 8/2012 | Yoko | |
| 2012/0203954 A1 | 8/2012 | Sun et al. | |
| 2012/0320653 A1* | 12/2012 | Yoko | H05K 1/18 365/63 |
| 2013/0163364 A1 | 6/2013 | Park | |
| 2014/0043885 A1* | 2/2014 | Riho | G11C 11/4093 257/777 |
| 2016/0012865 A1 | 1/2016 | Lee et al. | |
| 2016/0225431 A1 | 8/2016 | Best et al. | |
| 2017/0125119 A1 | 5/2017 | Loh et al. | |
| 2019/0138412 A1* | 5/2019 | Ogasawara | G11C 29/38 |
| 2020/0043530 A1 | 2/2020 | Shibata | |

OTHER PUBLICATIONS

International Search Report and Written Opinion for Application No. PCT/US2019/041449, dated Oct. 31, 2019.
PCT Application No. PCT/US2019/041449 titled "Bank and Channel Structure of Stacked Semiconductor Device" filed Jul. 11, 2019.
TW Office Action for Application No. 108123715, dated Mar. 19, 2020.
U.S. Appl. No. 16/051,445 titled "Bank and Channel Structure of Stacked Semiconductor Device" filed Jul. 31, 2018.

* cited by examiner

BANK AND CHANNEL STRUCTURE OF STACKED SEMICONDUCTOR DEVICE

CROSS-REFERENCE TO RELATED APPLICATION(S)

This application is a divisional of U.S. patent application Ser. No. 16/051,445, filed Jul. 31, 2018. This application is incorporated by reference herein in its entirety and for all purposes.

BACKGROUND

High data reliability, high speed of memory access, lower power consumption and reduced chip size are features that are demanded from semiconductor memory. In recent years, three-dimensional (3D) memory devices by stacking dies vertically stacked and interconnecting the dies using through-silicon vias (TSVs) have been introduced. Benefits of the 3D memory devices include a plurality of core chips stacked with a large number of vertical vias between the plurality of core chips and an interface chip and the memory controller, which allow wide bandwidth buses with high transfer rates between functional blocks in the plurality of core chips and the interface chip, and a considerably smaller footprint. Thus, the 3D memory devices contribute to large memory capacity, higher memory access speed and chip size reduction. Such 3D memory devices include Hybrid Memory Cube (HMC) and High Bandwidth Memory (HBM).

The large number of vertical vias transfer a clock signal, memory cell data and command sequences for controlling the memory core chips simultaneously in a manner that the plurality of core chips can be operated independently and simultaneously at high transfer rates. Here, a plurality of input/output channels on the core chips are not necessarily synchronous to each other. To accommodate such operation, the 3D memory device typically include a large number of circuits that operate simultaneously, which causes simultaneous power consumption throughout the device. In particular, the 3D memory device may allow a plurality of memory core chips to operate similar operations throughout circuits on each memory core chip simultaneously at high transfer rates while allowing the interface chip in the 3D memory device to transfer data high rates simultaneously.

FIG. 1A is a simplified layout diagram of channel configuration of a plurality of memory core chips 10a to 10d in a conventional 3D memory device 1 according to the prior art. FIGS. 1B and 1C are schematic diagrams of the conventional 3D memory device 1 including an interface chip 11 and the plurality of memory core chips 10a to 10d, according to the prior art. For example, the conventional 3D memory device 1 includes the memory core chips 10a to 10d stacked on the interface chip 11. The memory core chip 10c is on the memory core chip 10d, the memory core chip 10b is on the memory core chip 10c, and the memory core chip 10a is on the memory core chip 10b. The memory core chips 10a and 10c are provided with a first plurality of channels (e.g., Channels A, B, C and D). The memory core chips 1b and 1d are provided with a second plurality of channels (e.g., Channels E, F, G and H). Each channel in the memory core chips 10a to 10d includes a plurality of sub channels (e.g., PC0, PC1, PC2 and PC3). Each sub channel of the plurality of sub channels (e.g., PC0, PC1, PC2 and PC3) may be provided for a plurality of memory cell bank groups (e.g., BG0 and BG1, or BG2 and BG3). The plurality of memory core chips 10a to 10d and the interface chip 11 are coupled to each other by a plurality of through electrodes (not shown) and a plurality of internal connectors (not shown).

In the memory core chips 10a and 10b, data access using a plurality of memory cell bank groups (BG0 and BG1) is executed during data transfer operation. In the memory core chips 10c and 10d, data access using another plurality of memory cell bank groups (BG2 and BG3) is executed during data transfer operation. The plurality of sub channels (PC0, PC1, PC2 and PC3) in each channel operate simultaneously. The first plurality of channels (Channels A to D) on each memory core chip of the plurality of memory core chips 10a and 10c are designed to simultaneously operate. Thus, the memory cell bank groups BG0 and BG1 of the plurality of sub channels PC0 to PC3 of the plurality of channels (Channel A to D) on the memory core chip 1a are accessed during a continuous data transfer operation. Similarly, the second plurality of channels (Channels E to H) on each memory core chip of the plurality of memory core chips 10b and 10d are designed to simultaneously operate. Thus, the memory cell bank groups BG0 and BG1 of the plurality of sub channels PC0 to PC3 of the plurality of channels (Channel E to H) on the memory core chip 10b are accessed during a continuous data transfer operation. Memory cell bank groups BG2 and BG3 of the plurality of sub channels PC0 to PC3 of the plurality of channels Channel A to D on the memory core chip 10c are accessed during a continuous data transfer operation. For example, in FIG. 1B, the memory cell bank groups BG0 and BG1 of all channels, as highlighted in solid gray dot patterns, on the memory core chips 10a and 10b are simultaneously activated for continuous data transfer. For example, in FIG. 1C, the memory cell bank groups BG0 and BG1 of Channels E to H on the memory core chips 10b and the memory cell bank groups BG2 and BG3 of Channels A to D on the memory ore chip 10c, as highlighted in solid gray dot patterns, are simultaneously activated for the continuous data transfer operation.

In FIG. 11, the memory cell bank groups BG0 and BG are alternately accessed in the plurality of channels inside the memory core chips 10a and 10b, while the memory core chip 10a on the uppermost layer and the adjacent memory core chip 10b on the second uppermost layer are simultaneously activated for the continuous data transfer. On the other hand, in FIG. 1C, the memory cell bank groups BG0 and BG1 are alternately accessed in the plurality of channels inside the memory core chip 10b, and the memory cell bank groups BG2 and BG3 are alternately accessed in the plurality of channels inside the memory core chip 10c, while the memory core chips 10b and the adjacent memory core chip 10c are simultaneously activated for the continuous data transfer.

FIG. 1D is a schematic diagram of a conventional 3D memory device 1' including an interface chip 1' and a plurality of memory core chips 10'a to 10'h, according to the prior art. The memory core chips 10'a and 10'e are provided with a first plurality of channels (e.g., Channels A, B, C and D). The memory core chips 10'b and 10'f are provided with a second plurality of channels (e.g., Channels E, F, G and H). The memory core chips 10'c and 10'g are provided with a third plurality of channels (e.g., Channels I, J, K and L). The memory core chips 10'd and 10'h are provided with a fourth plurality of channels (e.g., Channels M, N, O and P). For example, in FIG. 1D, the memory cell bank groups B00 and BG1 of all channels, as highlighted in solid gray dot patterns, on the memory core chips 10'a to 10'd on the uppermost four layers are simultaneously activated for continuous data transfer and the memory cell bank groups BG0 and BG1 are alternately accessed in the plurality of channels inside the memory core chips 10'a, 10'b, 10'd and 10'd.

Simultaneous power consumption throughout 3D memory devices on the adjacent layers, especially at the upper most layers, as described above may cause a considerable voltage drop at portions of the large number of circuits having high wiring resistance with respect to a power supply source. This voltage drop may cause unstable operations at the portions of the large number of circuits.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments am described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
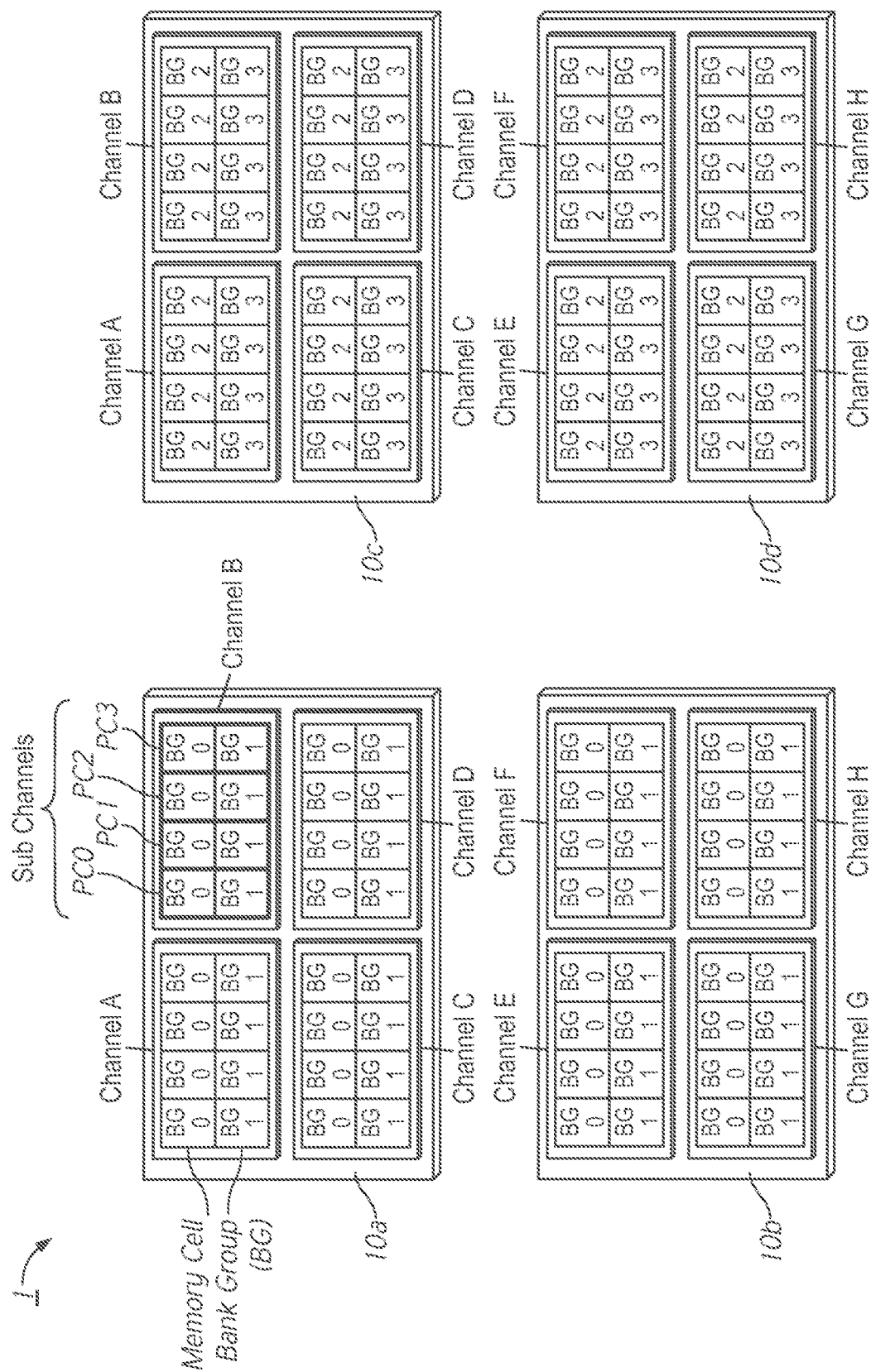
FIG. 1A is a simplified layout diagram of channel configuration of a plurality of memory core chips in a conventional 3D memory device according to the prior art.
Figures 1B, 1C:
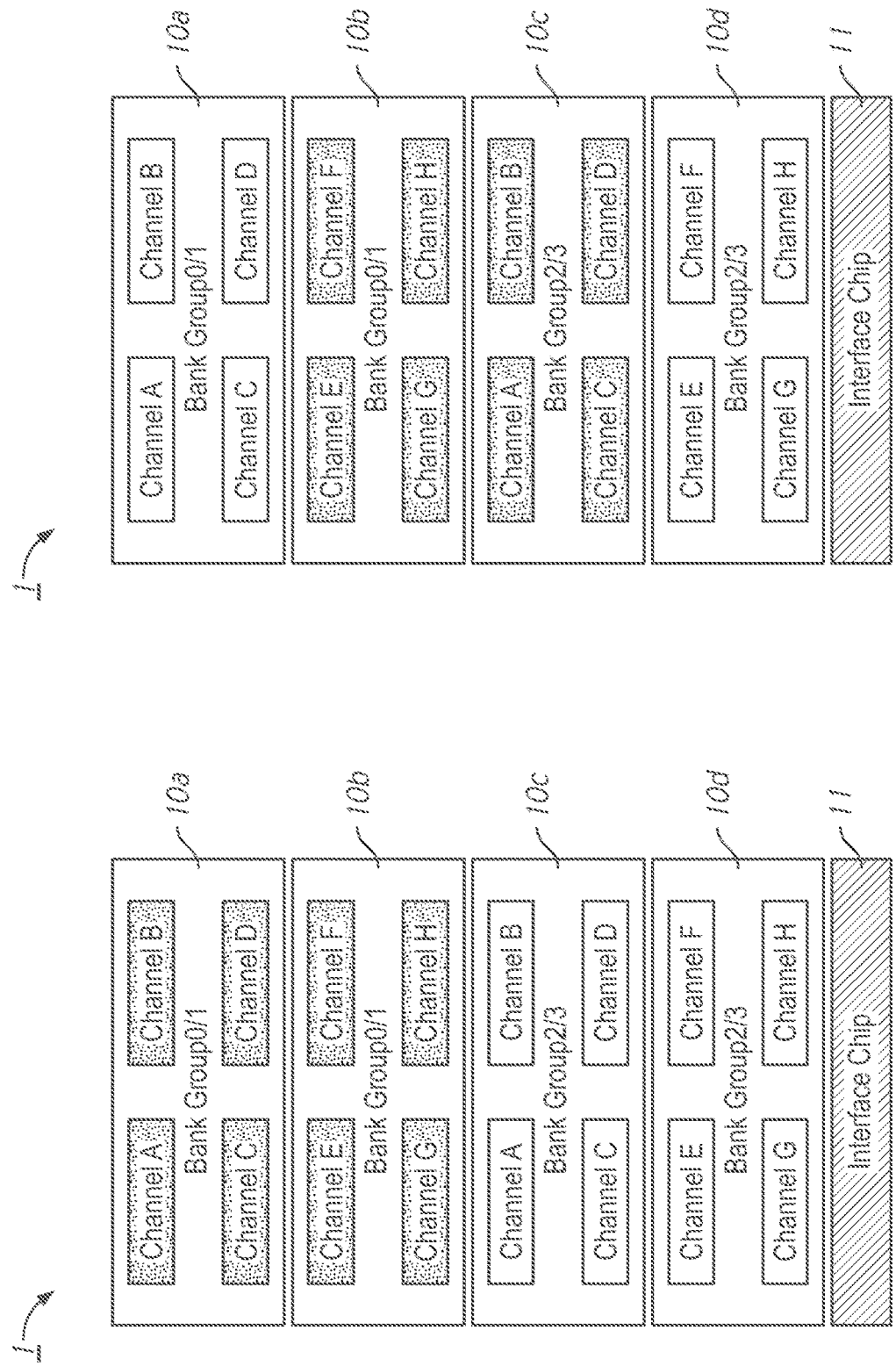
FIGS. 1B and 1C are schematic diagrams of the conventional 3D memory device including an interface chip and the plurality of memory core chips, according to the prior art.
Figure 1D:
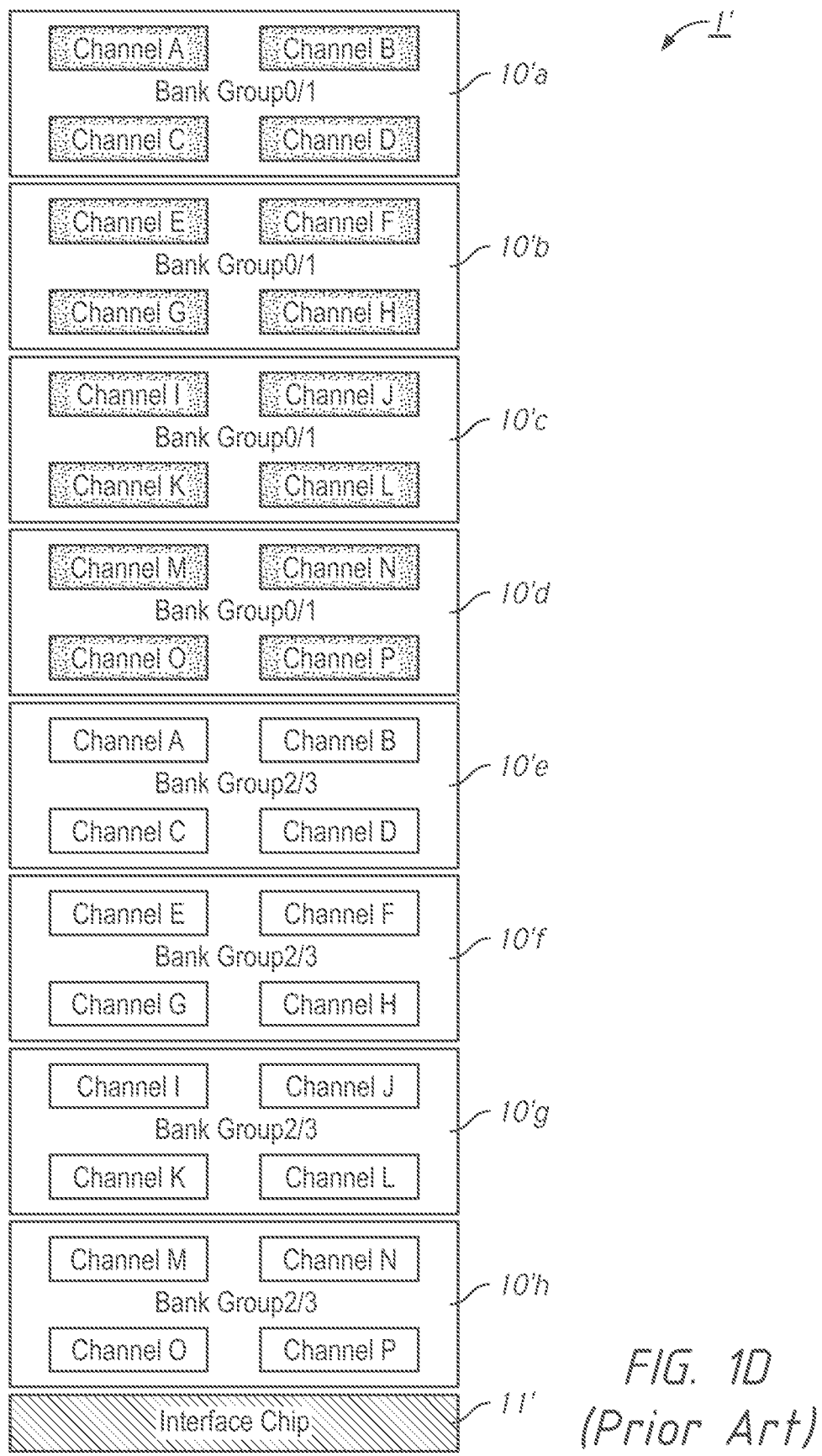
FIG. 1D is a schematic diagram of a conventional 3D memory device including an interface chip and a plurality of memory core chips, according to the prior art.
Figure 2:
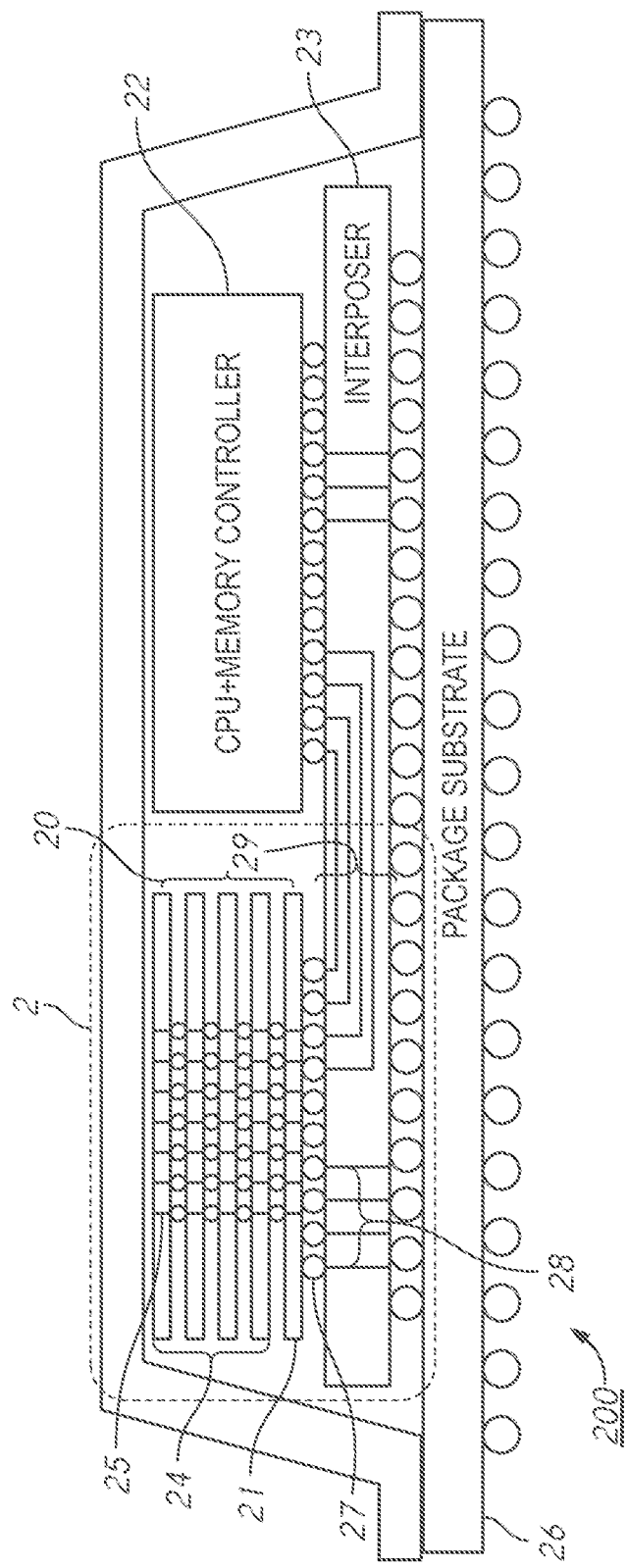
FIG. 2 is a schematic diagram of a semiconductor system including a semiconductor memory device in accordance with an embodiment of the present disclosure.

FIG. 2 is a schematic diagram of a semiconductor system 200 including an apparatus, which is a semiconductor memory device 2 in accordance with an embodiment of the present disclosure. For example, the semiconductor memory device 2 may be a three-dimensional (3D) memory device. The semiconductor system 200 may also include a central processing unit (CPU) and memory controller 22, which may be a controller chip, on an interposer 23 on a package substrate 26. The interposer 23 may include one or more power lines 28 which may supply power supply voltage from the package substrate 26. The interposer 23 may include a plurality of channels 29 that may interconnect the CPU and memory controller 22 and the semiconductor memory device 2. For example, the semiconductor memory device 2 may be an HBM, an HMC, a Wide-IO DRAM, etc. The memory controller 22 may provide a clock signal, a command signal, and may further transmit and receive data signals. The plurality of channels 29 may transmit the data signals between the memory controller and the semiconductor memory device 2. The semiconductor memory device 2 may include a plurality of chips 20 including an interface chip 21 and a plurality of memory core chips 24 stacked with each other. Each of the memory core chip 24 may include a plurality of memory cells and circuitries accessing the memory cells. For example, the memory cells may be a dynamic random access memory (DRAM) memory cells. The semiconductor memory device 2 may include conductive vias TSVs 25 (e.g., through substrate electrodes) which couple the interface chip 21 and the plurality of core chips 24 by penetrating the interface chip 21 and the plurality of core chips 24. The interface chip 21 may be coupled to the interposer 23 via interconnects, such as bumps 27. For example, the bumps 27 may be microbumps having bump pitches of less than about or less than one hundred micrometers and exposed on an outside of the interface chip 21. A portion of the bumps 27 may be coupled to the one or more power lines 28. Another portion of the bumps 27 may be coupled to the plurality of channels 29.

Figure 3B:
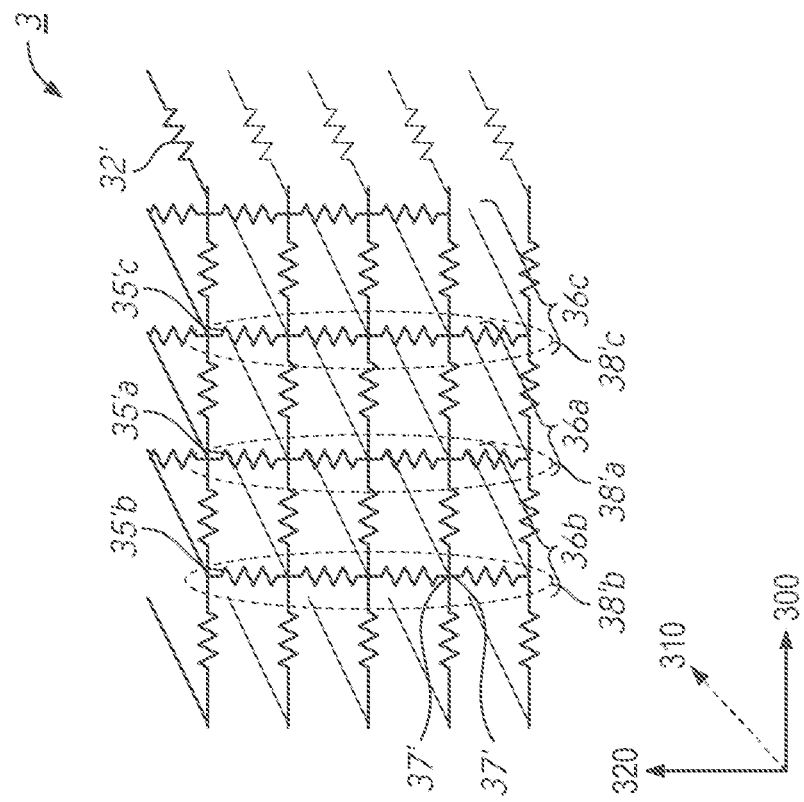
FIG. 3B is a schematic diagram of power supply through electrodes and power supply wirings in the 3D memory device of FIG. 3A, in accordance with an embodiment of the present disclosure.
Figure 3A:
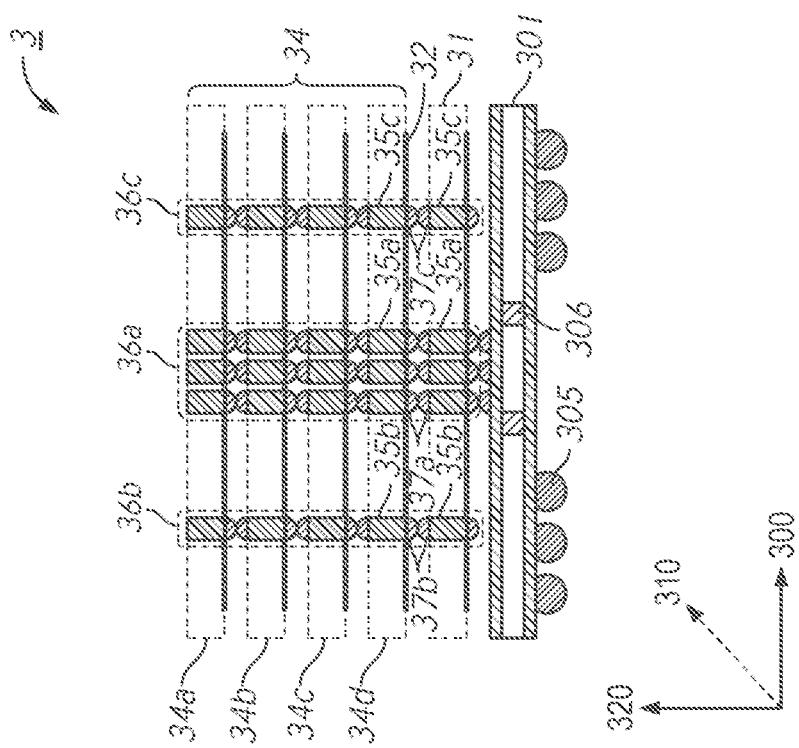
FIG. 3A is a schematic diagram of a 3D memory device including an interface chip, a plurality of core chips, conductive wirings and a plurality of through electrodes, in accordance with an embodiment of the present disclosure.

FIG. 3A is a schematic diagram of a 3D memory device 3 including an interface chip 31, a plurality of memory core chips 34, conductive wirings 32 and a plurality of through electrodes 35a to 35c, in accordance with an embodiment of the present disclosure. For example a number of the plurality of memory core chips 34 may be four, including memory core chips 34a, 34b, 34c and 34d. The memory core chips 34a to 34d may be extended on planes in parallel to a plane defined by a first direction 300 and a second direction 310. The plurality of through electrodes 35a to 35c may be coupled by a plurality of terminals 37a to 37c in a series in a direction 320 perpendicular to the planes of the plurality of memory core chips 34a to 34d, defined by the first direction 300 and the second direction 310. The plurality of through electrodes 35a to 35c may transmit signals, such as clock signals, command signals and data signals, from a plurality of external terminals 305 through a plurality of substrate wirings 306 of a substrate 301 to the interface chip 31 and the plurality of memory core chips 34a to 34d. The plurality of external terminals 305 may be coupled to the plurality of channels 29 in FIG. 2. Thus the memory controller 22 in FIG. 2 may provide the clock signals, the command signals and the data signals to the interface chip 31 and the plurality of memory core chips 45 via the plurality of channels 29, the plurality of external terminals 305, and the plurality of through electrodes 35a to 35c. The through electrodes 35a to 35c may further transmit signals between the interface chip 31 and the plurality of memory core chips 34a to 34d through wirings 32 along the planes of the interface chip 31 and the plurality of memory core chips 34a to 34d.

FIG. 3B is a schematic diagram of power supply through electrodes 35'a to 35'c and power supply wirings 32' in the 3D memory device 3, in accordance with an embodiment of the present disclosure. For example, the 3D memory device 3 may be the 3D memory device 2 in FIG. 2. In FIG. 3B, each of the power supply through electrodes 35'a to 35'c and the power supply wirings 32' may be modeled as a resistor. Each of the resistor groups 38'a to 38'c may include the plurality of power supply through electrodes 35'a to 35'c and a plurality of terminals 37', respectively. The plurality of power supply through electrodes 35'a are coupled by the plurality of terminals 37' in series along a third direction 320 that is perpendicular to the first and second directions 300, 310. Similarly, the plurality of power supply through electrodes 35'b are coupled in series along the direction 320 by the plurality of terminals 37', and the plurality of power supply through electrodes 35'c are coupled in series along the direction 320 by the plurality of terminals 37'. A circuit (not shown) may be disposed between the through electrodes 35'a and 35'b or between the through electrodes 35'a and 35'c. The power supply through electrodes 35'a may supply the power supply voltage to the interface chip 31 and the plurality of memory core chips 34a to 34d disposed in a center area of each chip (e.g., an area 36a in FIG. 3A), but also through power supply wirings 32' of FIG. 3B. In this case, a resistance between the external terminals 305 and a portion at an electrically farther end (e.g., a circuitry portion at the chip end) becomes smaller when the wiring resistance on an identical chip is substantially the same and when additional electrical paths for power supply are provided by the power supply wirings located in the areas 36b and 36c to stabilize operations in the circuits.

Figure 3C:
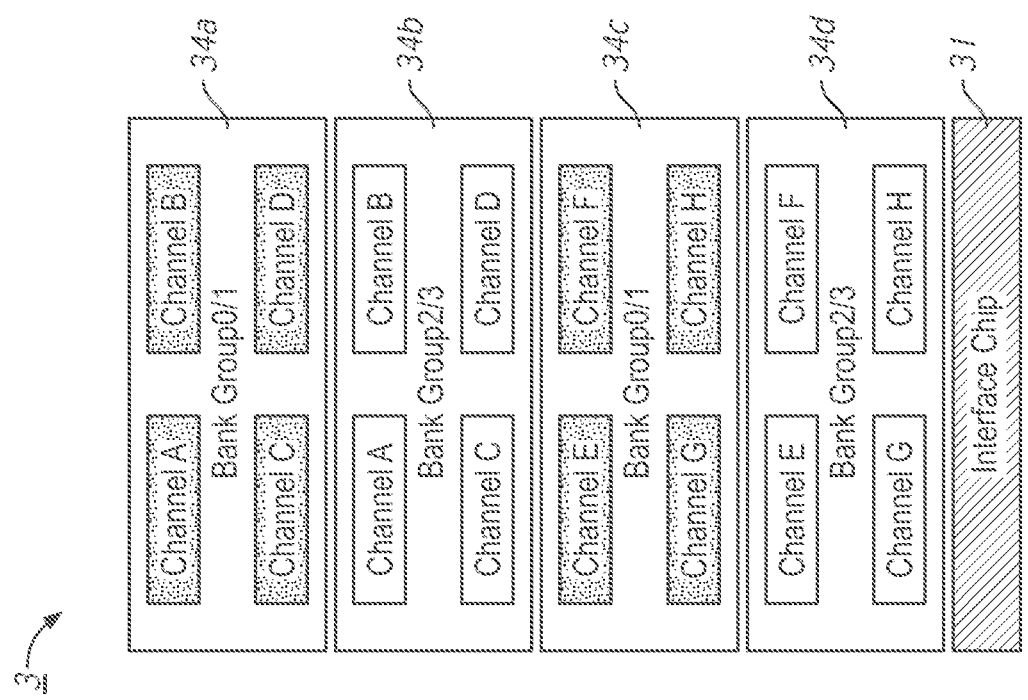
FIG. 3C is a schematic diagram of bank and channel configuration in the plurality of memory core chips in the 3D memory device of FIG. 3A, in accordance with an embodiment of the present disclosure.

FIG. 3C is a schematic diagram of bank and channel configuration in the plurality of memory core chips 34a to 34d in the 3D memory device 3 of FIG. 3A, in accordance with an embodiment of the present disclosure. For example, the 3D memory device 3 may include the memory core chips 34a to 34d stacked on the interface chip 31. The memory core chip 34c is disposed on the memory core chip 34d, and disposed between the memory core chip 34b and the interface chip 31. The memory core chip 34b is disposed on the memory core chip 34c, and disposed between the memory core chip 34a and the interface chip 31. The memory core chip 34a is disposed on the memory core chip 34b. The memory core chips 34a and 34b may be provided with a first plurality of channels (e.g., Channels A, B, C and D). The memory core chips 34c and 34d may be provided with a second plurality of channels (e.g., Channels E, F, G and H). Each memory core chip of the memory core chips 34a and 34c may include a first plurality of memory cell bank groups BG0 and BG1 addressed by different bank addresses (e.g., BA0 for BG0, BA1 to BG1). Each memory core chip of the memory core chips 34b and 34d may include a second plurality of memory cell bank groups BG2 and BG3 addressed by different bank addresses (e.g., BA2 for BG2, BA2 to BG2). As described earlier, the plurality of memory core chips 34a to 34d and the interface chip 31 may be coupled to each other by a plurality of through electrodes 35a to 35c and a plurality of terminals 37a to 37c as shown in FIG. 3A. In FIG. 3C, the first plurality of memory cell bank groups BG0 and BG1 of all channels, as highlighted in solid gray dot patterns, on the memory core chip 34a and the memory core chip 34c, which is between the memory core chip 34b and the interface chip 31, may be activated for continuous data transfer, while the memory core chip 34b, adjacent to the memory core chips 34a and 34c, may be deactivated, responsive to a memory access command from the memory controller 22 in FIG. 2, indicative of either the bank address BA0 for the memory cell bank group BG0 or the bank address BA1 for the memory cell bank group BG1. In FIG. 3C, the first plurality of memory cell bank groups BG0 and BG1 are alternately accessed in the plurality of channels inside the memory core chips 34a and 34c, while the memory core chip 34a on the uppermost layer and the memory core chip 34c, which is closer to the interface chip 31 than the deactivated memory core chip 34b on the second upper most layer, may be activated for the continuous data transfer. Although not shown in FIG. 3C, memory cells on the memory core chips 34b and 34d may be activated and accessed while deactivating the memory core chips 34a and 34c similarly by memory access commands from the memory controller 22 indicative of either the bank address BA2 for the memory cell bank group BG2 or the bank address BA2 for the memory cell bank group BG2 in an alternating manner.

Figure 3D:
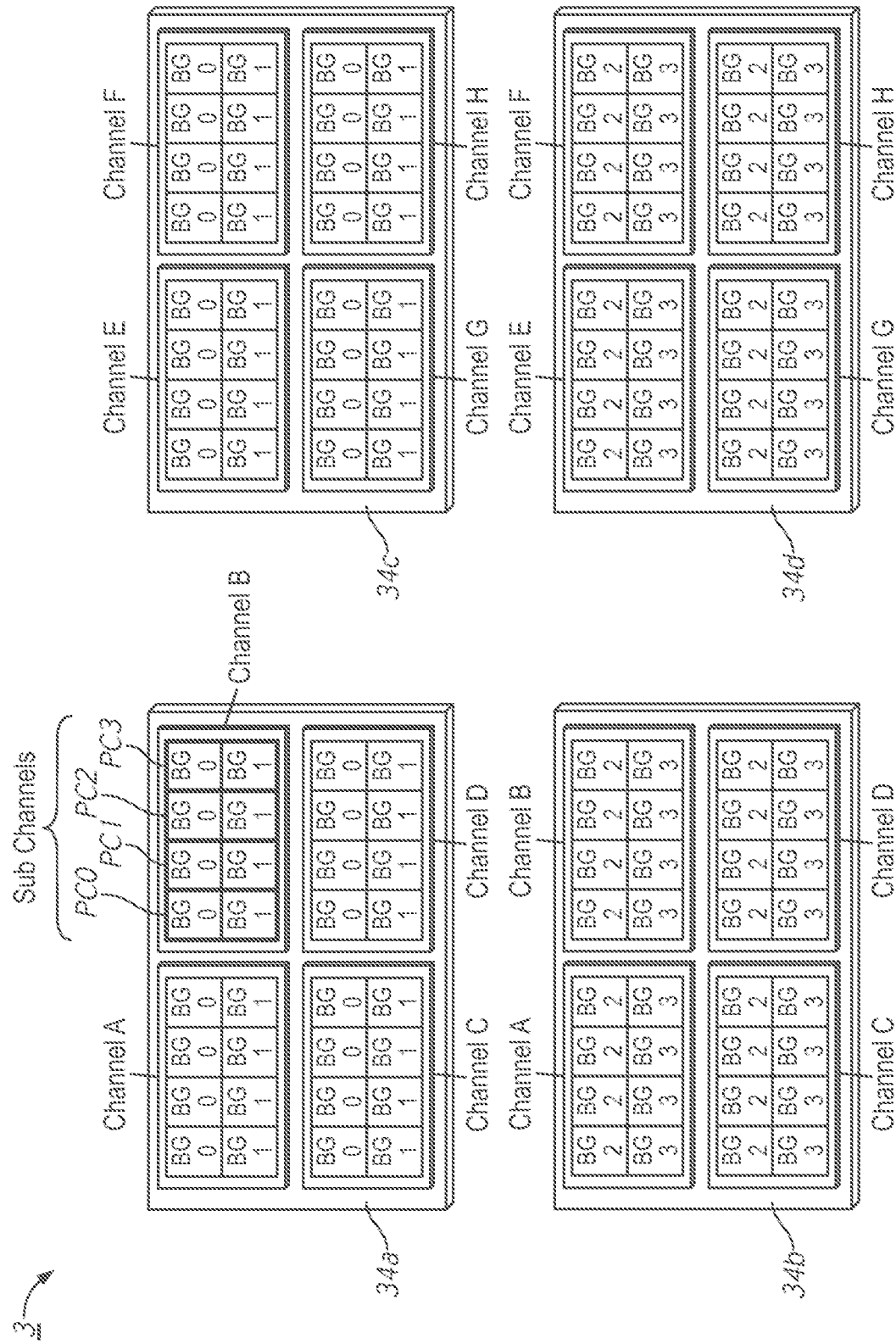
FIG. 3D is a layout diagram of the bank and channel configuration of the plurality of memory core chips in the 3D memory device of FIG. 3A, in accordance with an embodiment of the present disclosure.

FIG. 3D is a layout diagram of the bank and channel configuration of the plurality of memory core chips 34a to 34d in the 3D memory device 3 of FIG. 3A, in accordance with an embodiment of the present disclosure. In the memory core chip 34a and 34c, data access using the first plurality of memory cell bank groups (BG0 and BG1) is executed during data transfer operation. In the memory core chip 34b and 34d, data access using the second plurality of memory cell bank groups (BG2 and BG3) is executed during data transfer operation. Each channel in the memory core chips 34a to 34d may include a plurality of sub channels (e.g., PC0, PC, PC2 and PC3). Each sub channel of the plurality of sub channels (e.g., PC0, PC, PC2 and PC3) may be provided for the first and second pluralities of memory cell bank groups (e.g., BG0, BG1, BG2 and BG3). The plurality of sub channels (PC0, PC1, PC2 and PC3) in the first plurality of memory cell bank groups BG0 and BG1 each channel may operate. The first plurality of memory cell bank groups BG0 and BG of all channels, as highlighted in solid gray dot patterns, on the memory core chips 34a and 34c are activated for continuous data transfer. The first plurality of channels (Channels A to D) on the memory core chip 34a and the second plurality of channels (Channels E to H) on the memory core chip 34c are designed to operate continuous data transfer operation. Thus, the first plurality of memory cell bank groups BG0 and BG1 of the plurality of sub channels PC0 to PC3 of all the channels (Channel A to H) on the memory core chips 34a and 34c are accessed during a continuous data transfer operation. In a meanwhile, the second plurality of memory cell bank groups BG2 and BG3 on each memory core chip of the plurality of memory core chips 34b and 34d may be designed to operate continuous data transfer operation. Thus, the second plurality of memory cell bank groups BG2 and BG3 of the plurality of sub channels PC0 to PC3 of all the channels (Channel A to H) on the memory core chip 34b and 34d are accessed during the continuous data transfer operation.

Figure 3E:
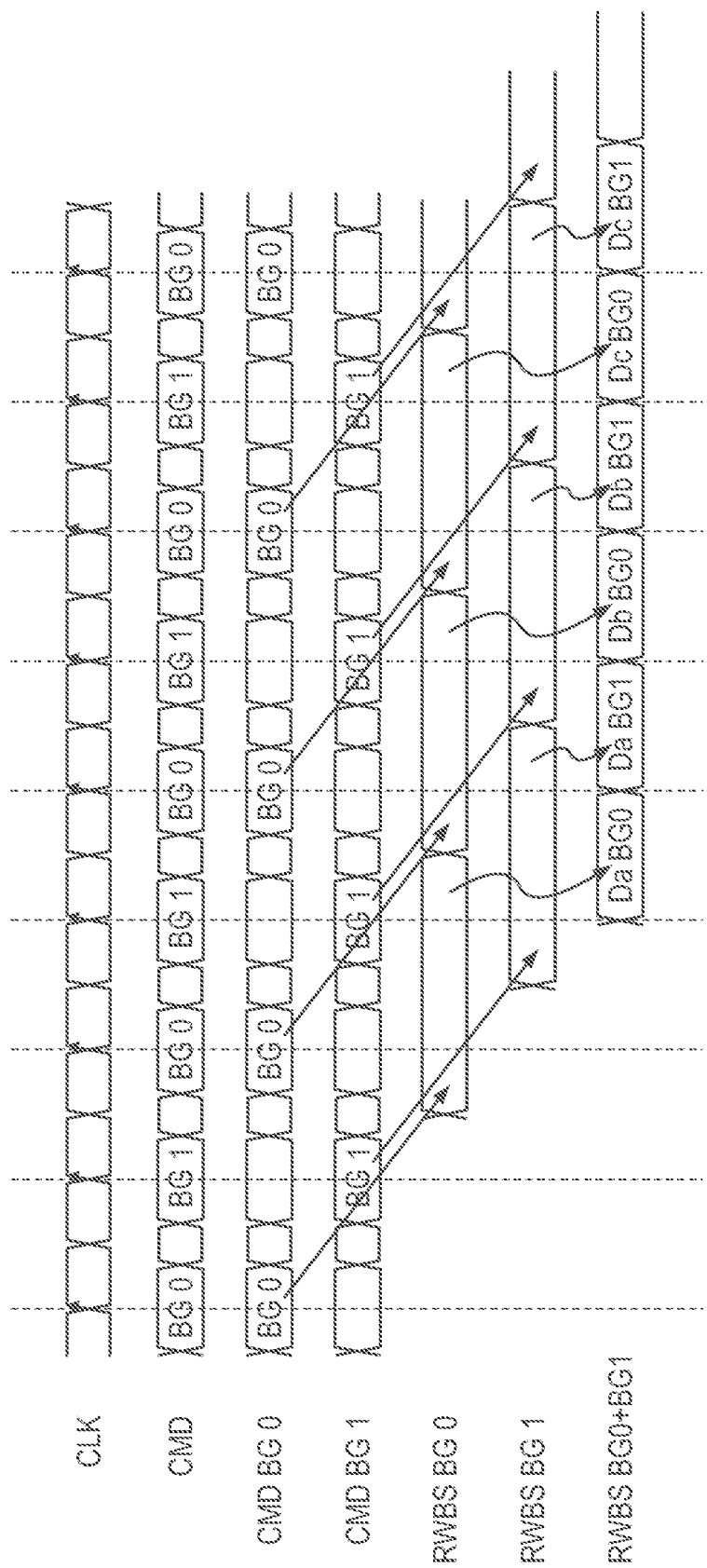
FIG. 3E is a timing diagram of signals in the 3D memory device of FIG. 3A, in accordance with an embodiment of the present disclosure.

FIG. 3E is a timing diagram of signals in the 3D memory device of FIG. 3A, in accordance with an embodiment of the present disclosure. For example, as described above with reference to FIG. 3C, the first plurality of memory cell bank groups BG0 and BG1 may be alternately accessed in the plurality of channels inside the memory core chips 34a and 34c. The memory controller 22 in FIG. 2 may provide memory access commands for the memory cell bank group BG0 and memory access commands for the memory cell bank group BG1 alternately each clock cycle (CLK), on a command signal (CMD). For example, the memory controller 22 in FIG. 2 may provide memory access commands including a memory access command including a memory cell address addressing a memory cell in the memory core chip 34a or the memory core chip 34c including a bank address associated with BG0 of the first plurality of memory cell bank groups BG0 and another memory access command including another memory cell address addressing another memory cell in the memory core chip 34a or the memory core chip 34c including another bank address associated with BG1 in an alternating manner. Either the memory core chips 34a and 34c may receive the memory access commands related to the memory cell bank groups BO0 and BG1 every other command alternately. Based on the memory cell access command for BG0 (CMD BG0), a read write data bus (RWBS) for the memory cell bank group BG0 may be activated to transmit the data with two clock cycles delay from the memory cell access command for BG0 (CMD BG0). Similarly, based on the memory cell access command for BG1 (CMD BG1), a read write data bus (RWBS) for the memory cell bank group BG1 may be activated to transmit the data with two clock cycles delay from the memory cell access command for BG1 (CMD BG1). The RWBS BG0 and RWBS BG1 may form double-speed data (RWBS BG0+BG1) by first-in-first-out control. The data of RWBS BG0+BG1 having the double-speed may be transferred to the interface chip 31 via a portion of the plurality of through electrodes 35a, 35b and 35c. Not shown in FIG. 3E, the memory core chips 34b and 34d may receive the memory access commands related to the memory cell bank groups BG2 and BG3 every other command alternately, in a similar manner, and may be activated based on the memory access commands related to the memory cell bank groups BG2 and BG3.

Figures 4A, 4B:
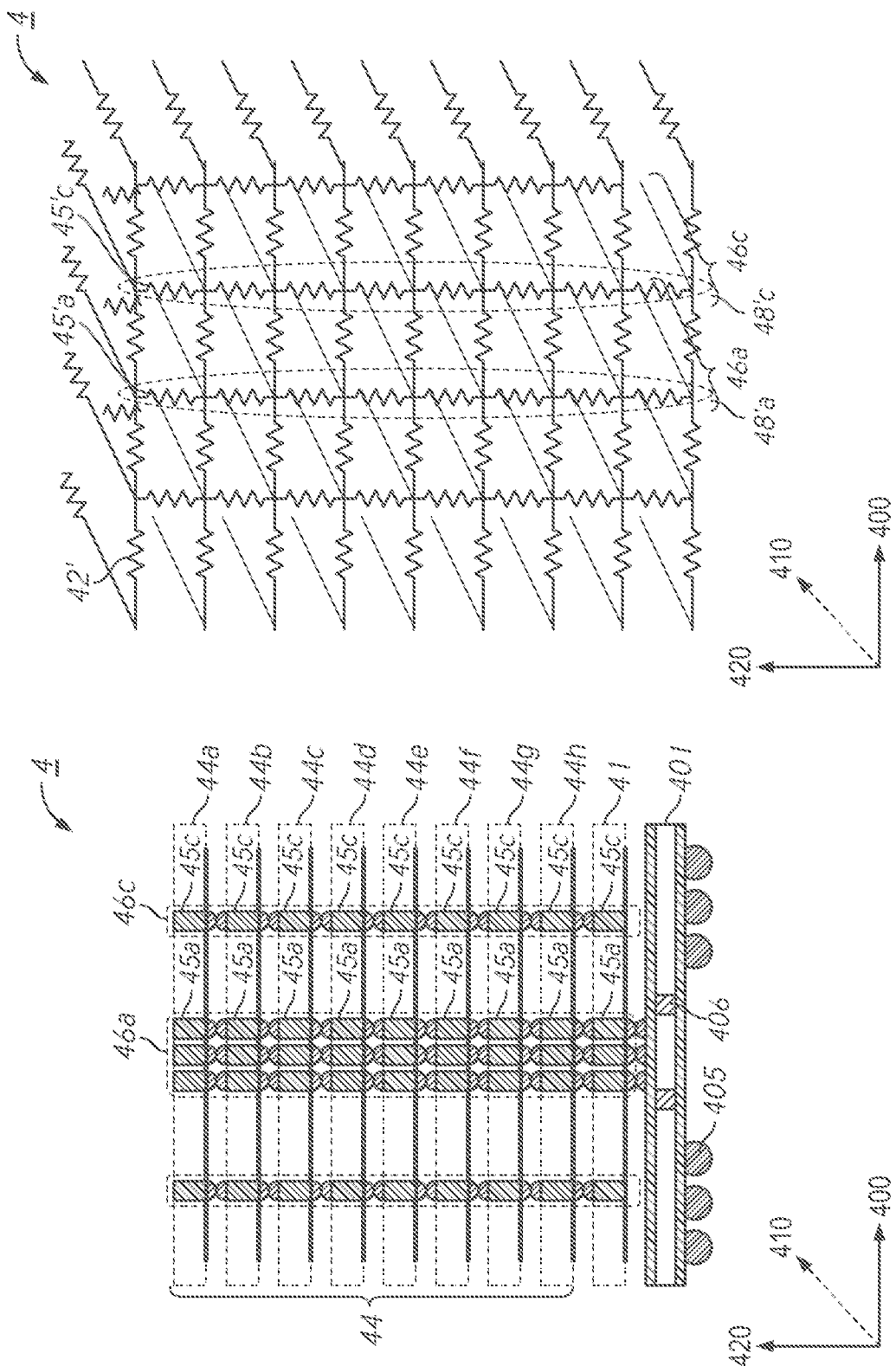
FIG. 4A is a schematic diagram of a 3D memory device including an interface chip, a plurality of core chips, conductive wirings and a plurality of through electrodes, in accordance with an embodiment of the present disclosure.
FIG. 4B is a schematic diagram of power supply through electrodes and power supply wirings in the 3D memory device of FIG. 4A, in accordance with an embodiment of the present disclosure.

FIG. 4A is a schematic diagram of a 3D memory device 4 including an interface chip 41, a plurality of core chips 44, and a plurality of through electrodes 45a and 45c, in accordance with an embodiment of the present disclosure. A plurality of through electrodes 45a and 45c may transmit signals, such as clock signals, command signals and data signals, from a plurality of external terminals 405 through a plurality of substrate wirings 406 of a substrate 401 to the interface chip 41 and the plurality of memory core chips 44. For example a number of the plurality of memory core chips 44 may be eight, including memory core chips 44a, 44b, 44c, 44d, 44e, 44f and 44g. The plurality of through electrodes 45a and 45c may be coupled by a plurality of terminals (not shown) in a series in a direction 420 perpendicular to planes of the plurality of memory core chips 44a to 44h, defined by directions 400 and 410, similarly to the 3D memory device 3 of FIG. 3A. The through electrodes 45a and 45c may further transmit signals between the interface chip 41 and the plurality of memory core chips 44a to 44h through wirings (not shown) in the interface chip 41 and the plurality of memory core chips 44a to 44h, along the planes of the interface chip 41 and the plurality of memory core chips 44a to 44d defined by the first and second direction 400, 410.

FIG. 4B is a schematic diagram of power supply through electrodes 45'a, 45'c, and power supply wirings 42' in the 3D memory device 4, in accordance with an embodiment of the present disclosure. For example, the 3D memory device 4 may be the 3D memory device 2 in FIG. 2. In FIG. 4B, each of the power supply through electrodes 45'a, 45'c and the power supply wirings 42' may be modeled as a resistor. Each of the resistor groups 48'a and 48'c may include the plurality of power supply through electrodes 45'a and 45'c and a plurality of terminals (not shown), respectively. The plurality of power supply through electrodes 45'a are coupled by the plurality of terminals (not shown) in series along a third direction 420 that is perpendicular to the first and second directions 400, 410. Similarly, the plurality of power supply through electrodes 45'c are coupled in series along the direction 420 by the plurality of terminals. A circuit (not shown) may be disposed between the through electrodes 45'a and 45'c. The power supply through electrodes 45'a may supply the power supply voltage to the interface chip 41 and the plurality of memory core chips 44a to 44h disposed in a center area of each chip (e.g., an area 46a in FIG. 4A), but also through power supply wirings 42' of FIG. 4B. In this case, a resistance between the external terminals 405 and a portion at an electrically farther end (e.g., a circuitry portion at the chip end) becomes smaller when the wiring resistance on an identical chip is substantially the same and when additional electrical paths for power supply are provided by the power supply wirings located in the areas 46c to stabilize operations in the circuits.

Figure 4C:
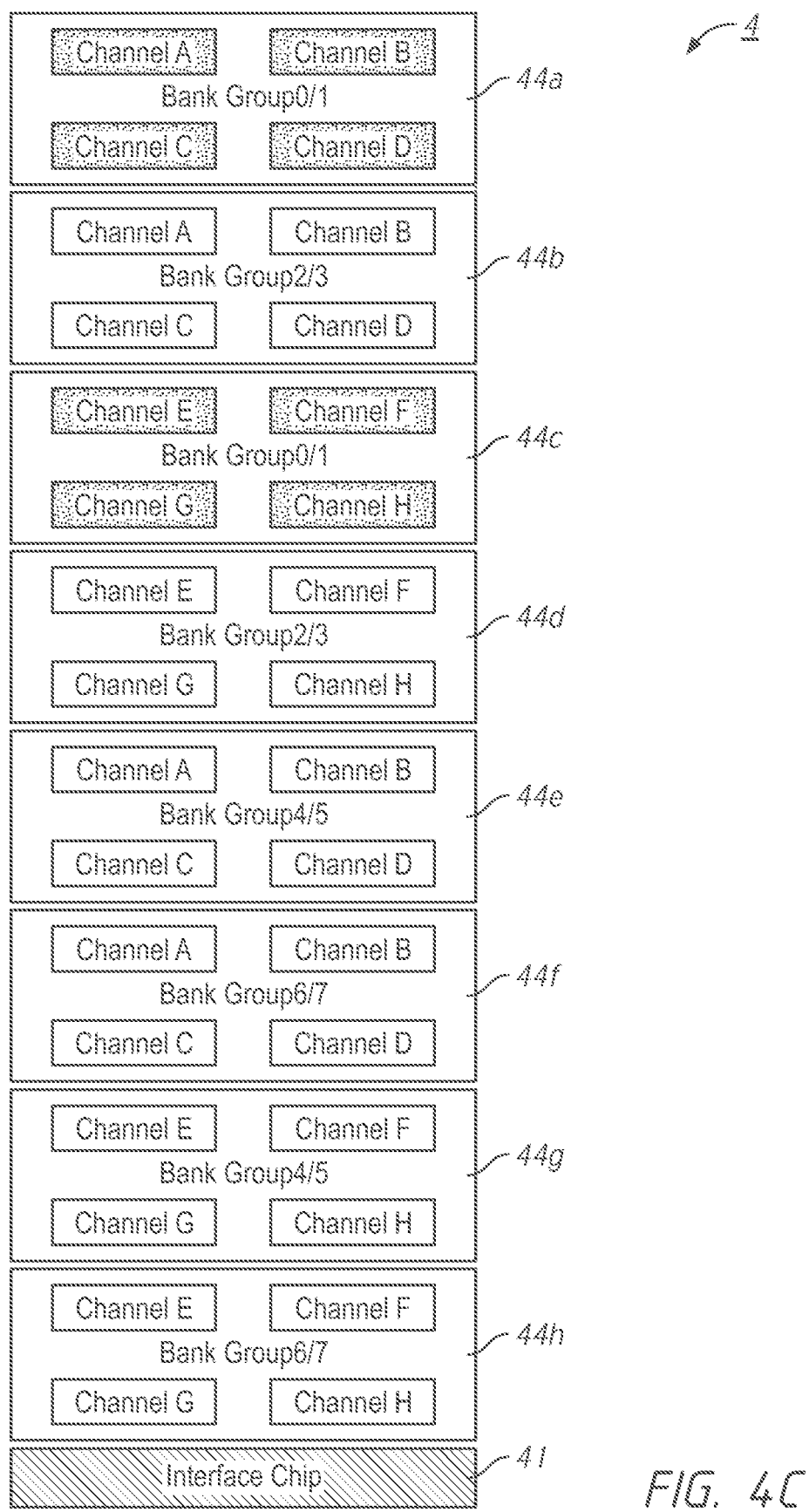
FIG. 4C is a schematic diagram of bank and channel configuration in a plurality of memory core chips in a 31) memory device, in accordance with an embodiment of the present disclosure.

FIG. 4C is a schematic diagram of bank and channel configuration in the plurality of memory core chips 44a to 44h in the 3D memory device 4, in accordance with an embodiment of the present disclosure. For example, the 3D memory device 4 may include the memory core chips 44a to 44h stacked on the interface chip 41. The memory core chip 44h is disposed on the interface chip 41. The memory core chip 44g is disposed on the memory core chip 44h, the memory core chip 44f is disposed on the memory core chip 44g, and the memory core chip 44e is disposed on the memory core chip 44f. The memory core chip 44d is disposed on the memory core chip 44e, the memory core chip 44c is disposed on the memory core chip 44d, the memory core chip 44b is disposed on the memory core chip 44c, and the memory core chip 44a is disposed on the memory core chip 44b. Thus, the memory core chip 44b is disposed between the interface chip 41 and the memory core chip 44a, and the memory core chip 44c is disposed between the interface chip 41 and the memory core chip 44b. The memory core chips 44a, 44b, 44e and 44f may be provided with a first plurality of channels (e.g., Channels A, B, C and D). The memory core chips 44c, 44d, 44g and 44h may be provided with a second plurality of channels (e.g., Channels E, F, G and H). Each memory core chip of the memory core chips 44a and 44c may include a first plurality of memory cell bank groups BG0 and BG1. Each memory core chip of the memory core chips 44b and 44d may include a second plurality of memory cell bank groups BG2 and BG3. Further, each memory core chip of the memory core chips 44e and 44g may include a third plurality of memory cell bank groups BG4 and BG5. Each memory core chip of the memory core chips 44f and 44h may include a fourth plurality of memory cell bank groups BG6 and BG7. The plurality of memory core chips 44a to 44h and the interface chip 41 may be coupled to each other by a plurality of through electrodes 45a and 45c and a plurality of terminals as shown in FIG. 4A. In FIG. 4C, the first plurality of memory cell bank groups BG0 and BG1 of all channels, as highlighted in solid gray dot patterns, on the memory core chip 44a and the memory core chip 44c, which is between the memory core chip 44b and the interface chip 41, may be activated for continuous data transfer while the memory core chip 44b, which is between the memory core chips 44a and 44c, may be deactivated. In FIG. 4C, the first plurality of memory cell bank groups BG0 and BG1 are alternately accessed in the plurality of channels inside the memory core chips 44a and 44c, while the memory core chip 44a on the uppermost layer and the memory core chip 44c on the third uppermost layer, closer to the interface chip 41 than the memory core chip 44b, may be activated for the continuous data transfer.

Figure 4D:
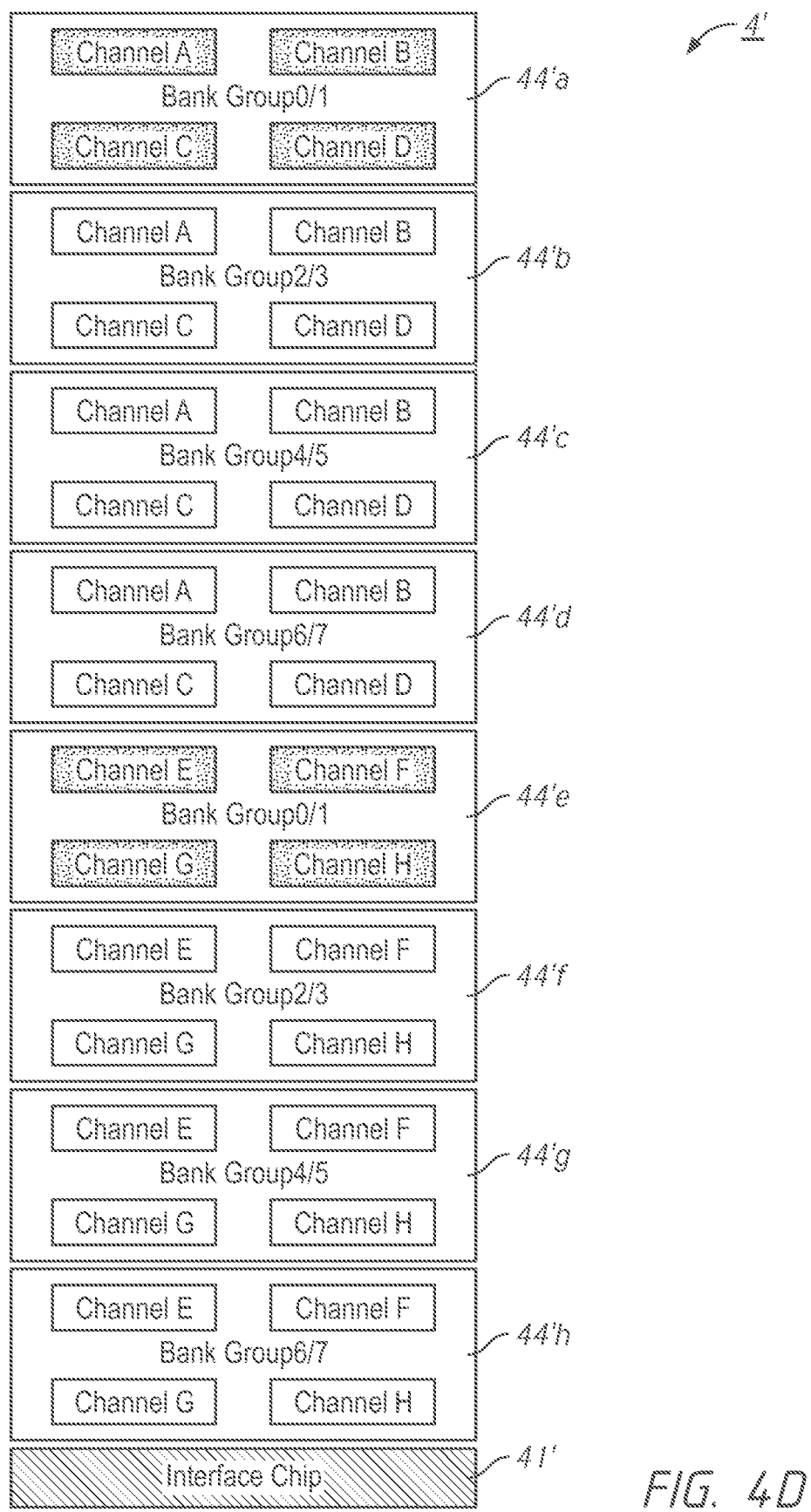
FIG. 4D is a schematic diagram of bank and channel configuration in a plurality of memory core chips in a 3D memory device, in accordance with an embodiment of the present disclosure.

FIG. 4D is a schematic diagram of bank and channel configuration in the plurality of memory core chips 44'a to 44'h in the 3D memory device 4', in accordance with an embodiment of the present disclosure. For example, the 3D memory device 4' may be the 3D memory device 4 of FIGS. 4A and 4B. For example, the 3D memory device 4' may include the memory core chips 44'a to 44'h stacked on the interface chip 41'. The memory core chip 44'h is disposed on the interface chip 41'. The memory core chip 44'g is disposed on the memory core chip 44'h, the memory core chip 44'f is disposed on the memory core chip 44'g, and the memory core chip 44'e is disposed on the memory core chip 44'f. The memory core chip 44'd is disposed on the memory core chip 44'e, the memory core chip 44'c is disposed on the memory core chip 44'd, the memory core chip 44'b is disposed on the memory core chip 44'c, and the memory core chip 44'a is disposed on the memory core chip 44'b. Thus, the memory core chip 44'c is disposed between the interface chip 41' and the memory core chip 44'a, and the memory core chip 44'e is disposed between the interface chip 41' and the memory core chip 44'c. Further, the memory core chip 44'b is disposed between the memory core chip 44'a and the memory core chip 44'c. The memory core chips 44'a, 44'b, 44'c and 44'd may be provided with a first plurality of channels (e.g., Channels A, B, C and D). The memory core chips 44'e, 44'f, 44'g and 44'h may be provided with a second plurality of channels (e.g., Channels E, F, G and H). Each memory core chip of the memory core chips 44'a and 44'e may include a first plurality of memory cell bank groups BG0 and BG1. Each memory core chip of the memory core chips 44'b and 44'f may include a second plurality of memory cell bank groups BG2 and BG3. Each memory core chip of the memory core chips 44'c and 44'g may include a third plurality of memory cell bank groups BG4 and BG5. Each memory core chip of the memory core chips 44'd and 44'h may include a fourth plurality of memory cell bank groups BG6 and BG7. The plurality of memory core chips 44'a to 44'h and the interface chip 41' may be coupled to each other by a plurality of through electrodes 45a and 45c and a plurality of terminals as shown in FIG. 4A. In FIG. 4D, the first plurality of memory cell bank groups BG0 and BG1 of all channels, as highlighted in solid gray dot patterns, on the memory core chips 44'a and 44'e may be activated for continuous data transfer. In FIG. 4D, the first plurality of memory cell bank groups BG0 and BG1 are alternately accessed in the plurality of channels inside the memory core chips 44'a and 44'e, while the memory core chip 44'a on the uppermost layer and the memory core chip 44'e on the fifth uppermost layer, closer to the interface chip 41' than the memory core chip 44'c may be activated for the continuous data transfer.

Figure 4E:
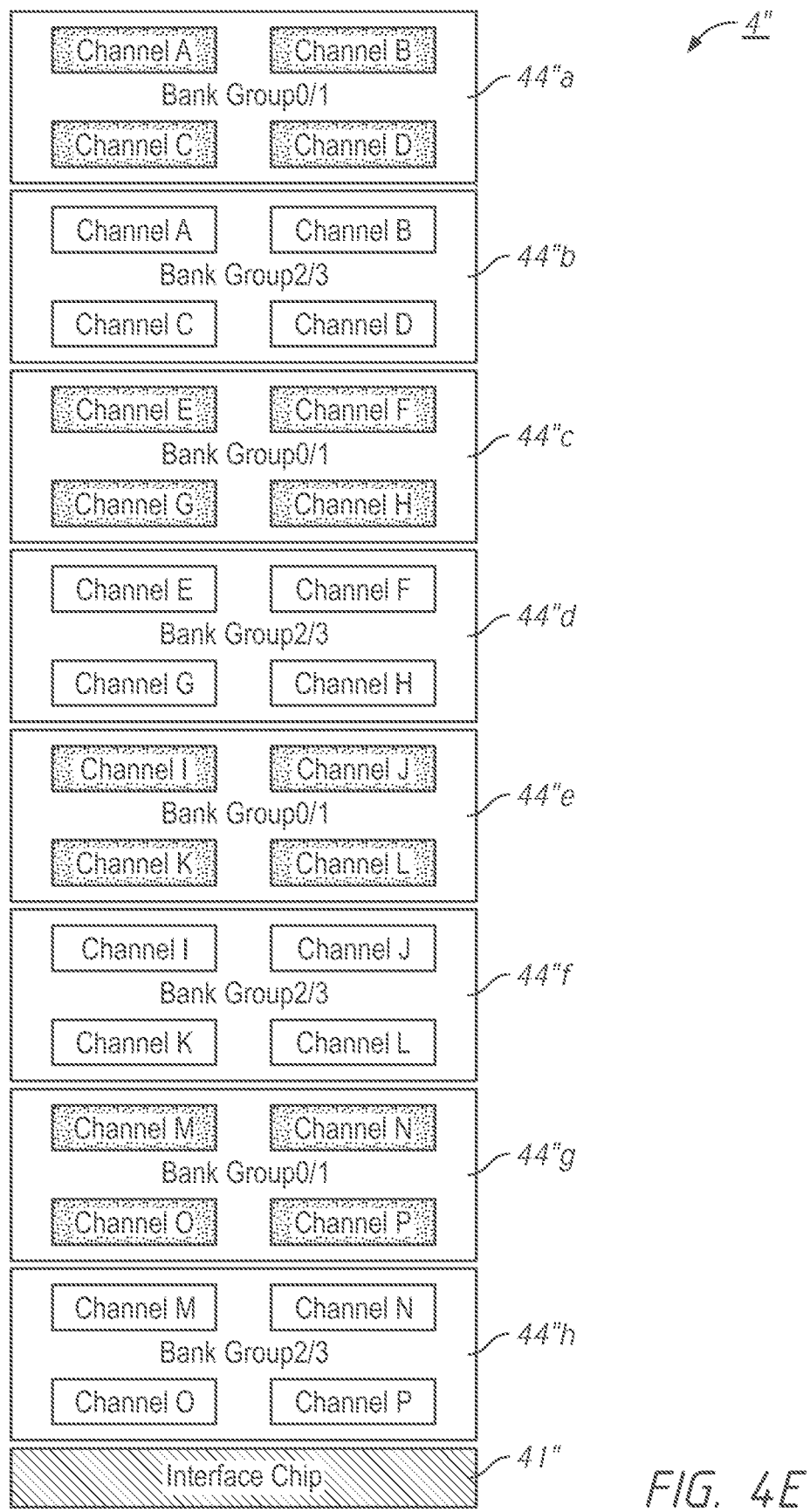
FIG. 4E is a schematic diagram of bank and channel configuration in a plurality of memory core chips in a 3D memory device, in accordance with an embodiment of the present disclosure.

FIG. 4E is a schematic diagram of bank and channel configuration in a plurality of memory core chips 44"a to 44"h in a 3D memory device 4", in accordance with an embodiment of the present disclosure.

For example, the 3D memory device 4" may be the 3D memory device 4 of FIGS. 4A and 4B. For example, the 3D memory device 4" may include the memory core chips 44"a to 44"h stacked on the interface chip 41". The memory core chip 44"h is disposed on the interface chip 41". The memory core chip 44"g is disposed on the memory core chip 44"h, the memory core chip 44"f is disposed on the memory core chip 44"g, and the memory core chip 44"e is disposed on the memory core chip 44"f. The memory core chip 44"d is disposed on the memory core chip 44"e, the memory core chip 44"c is disposed on the memory core chip 44"d, the memory core chip 44"b is disposed on the memory core chip 44"c, and the memory core chip 44"a is disposed on the memory core chip 44"b. The memory core chips 44"a and 44"b may be provided with a first plurality of channels (e.g., Channels A, B, C and D). The memory core chips 44"c and 44"d may be provided with a second plurality of channels (e.g., Channels E, F, G and H). The memory core chips 44"e and 44"f may be provided with a third plurality of channels (e.g., Channels I, J, K and L). The memory core chips 44"g and 44"h may be provided with a fourth plurality of channels (e.g., Channels M, N, O and P). Each memory core chip of the memory core chips 44"a, 44"c, 44"e and 44"g may include a first plurality of memory cell bank groups BG0 and BG1. Each memory core chip of the memory core chips 44"b, 44'd, 44"f and 44"h may include a second plurality of memory cell bank groups BG2 and BG3. Thus, the memory core chips 44"a, 44"c, 44"e and 44"g in the first plurality of memory cell bank groups BG0 and BG1 and the memory core chips 44"b, 44'd, 44"f and 44"h including the second plurality of memory cell bank groups BG2 and BG3 are disposed alternatingly. The plurality of memory core chips 44'a to 44'h and the interface chip 41' may be coupled to each other by a plurality of through electrodes 45a and 45c and a plurality of terminals as shown in FIG. 4A. In FIG. 4D, the first plurality of memory cell bank groups BG0 and BG1 of all channels, as highlighted in solid gray dot patterns, on the memory core chips 44"a, 44"c, 44"e and 44"g may be activated for continuous data transfer. In FIG. 4D, the first plurality of memory cell bank groups BG0 and BG1 are alternately accessed in the plurality of channels inside the memory core chips 44"a, 44"c, 44"e and 44"g, while the memory core chip 44"a on the uppermost layer, the memory core chip 44"c on the third uppermost layer, the memory core chip 44"e on the fifth uppermost layer and the memory core chip 44"g on the second lowermost layer, closer to the interface chip 41" may be activated for the continuous data transfer, while the adjacent memory core chips 44"b, 44"d, 44"f and 44"h may not be activated.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a first memory core chip including a first memory bank assigned to a first channel;
a second memory core chip including a second memory bank assigned to the first channel;
a third memory core chip including a third memory bank assigned to a second channel; and
a fourth memory core chip including a fourth memory bank assigned to the second channel,
wherein the first, second, third, and fourth memory core chips are stacked with one another such that the second memory core chip is between the first and third memory core chips and the third memory core chip is between the second and fourth memory core chips,
wherein the first memory core chip and the third memory core chip are configured to be activated for data transfer responsive to a first plurality of commands that are indicative of a first bank address associated with a first memory cell bank group, and
wherein the second memory core chip and the fourth memory core chip are configured to be activated for data transfer responsive to a second plurality of commands that are indicative of a second bank address associated with a second memory cell bank group that is different from the first memory cell bank group.

2. The apparatus of claim 1, further comprising:
a fifth memory core chip including a fifth memory bank assigned to the first channel;
a sixth memory core chip including a sixth memory bank assigned to the first channel;
a seventh memory core chip including a seventh memory bank assigned to the second channel; and
an eighth memory core chip including an eighth memory bank assigned to the second channel,
wherein the fifth, sixth, seventh and eighth memory core chips are stacked over the first memory core chip such that the eighth memory core chip is between the first and seventh memory core chips and the sixth memory core chip is between the fifth and seventh memory core chips.

3. The apparatus of claim 1, further comprising:
a fifth memory core chip including a fifth memory bank assigned to the first channel, the fifth memory core chip being stacked over the first memory core chip;
a sixth memory core chip including a sixth memory bank assigned to the first channel, the sixth memory core chip being between the first and second memory core chips;
a seventh memory core chip including a seventh memory bank assigned to the second channel, the seventh memory core chip being between the second and third memory core chips; and
an eighth memory core chip including an eighth memory bank assigned to the second channel, the eighth memory core chip being between the third and fourth memory core chips.

4. The apparatus of claim 1, further comprising:
a fifth memory core chip including a fifth memory bank assigned to a third channel;
a sixth memory core chip including a sixth memory bank assigned to the third channel;
a seventh memory core chip including a seventh memory bank assigned to a fourth channel; and
an eighth memory core chip including an eighth memory bank assigned to the fourth channel,
wherein the fifth, sixth, seventh and eighth memory core chips are stacked over the first memory core chip such that the eighth memory core chip is between the first and seventh memory core chips and the sixth memory core chip is between the fifth and seventh memory core chips.

5. The apparatus of claim 1, wherein the first memory core chip further comprises a fifth bank,
wherein the first channel comprises:
a first sub channel configured to provide a first memory access command including the first bank address; and
a second sub channel configured to provide a second memory access command including a third bank address addressing a third memory bank group including the fifth bank.

6. The apparatus of claim 1,
wherein the first memory core chip further includes a fifth memory bank assigned to a third channel,
wherein the second memory core chip further includes a sixth memory bank assigned to the third channel,
wherein the third memory core chip further includes a seventh memory bank assigned to a fourth channel, and
wherein the fourth memory core chip further including an eighth memory bank assigned to the fourth channel.

7. The apparatus of claim 6, further comprising an interface chip configured to access the first, second, third and fourth memory core chips through the first, second, third and fourth channels,
wherein the first, second, third and fourth memory core chips are stacked over the interface chip such that the fourth memory chip is between the third memory core chip and the interface chip.

8. The apparatus of claim 1, further comprising a plurality of electrodes coupled to the first, second, third and fourth memory core chips and the interface chip,
wherein the plurality of electrodes are configured to transmit memory access commands.

9. The apparatus of claim 8, wherein the memory access commands include a bank address,
wherein the first memory bank and the third memory bank are included in a first memory bank group addressed by a first bank address as the bank address, and the second memory bank and the fourth memory bank are included in a second memory bank group addressed by a second bank address as the bank address.

10. An apparatus comprising:
an interface chip configured to receive clock signals, command signals, and data signals via a plurality of channels including a first channel and a second channel; and
a plurality of memory core chips stacked on the interface chip wherein the plurality of memory core chips and the interface chip are coupled to each other, the plurality of memory core chips including:
a first memory core chip including a first memory cell bank group addressed by a first bank address and configured to be accessed in the first channel;

a second memory core chip disposed between the first memory core chip and the interface chip, the second memory core chip including a second memory cell bank group addressed by a second bank address and configured to be accessed in the first channel; and a third memory core chip disposed between the second memory core chip and the interface chip, the third memory core chip including a third memory bank group addressed by the first bank address and configured to be accessed in the second channel;

wherein the first memory core chip and the third memory core chip are configured to be activated for data transfer responsive to a first plurality of commands that are indicative of the first bank address, and wherein the second memory core chip is configured to be activated for data transfer responsive to a second plurality of commands that are indicative of the second bank address.

11. The apparatus of claim 10, further comprising a fourth memory core chip between the third memory core chip and the interface chip, the fourth memory core chip including a fourth memory bank group addressed by the second bank address and configured to be accessed in the second channel.

12. The apparatus of claim 10, further comprising a plurality of electrodes, wherein each memory core chip of the plurality of memory core chips is coupled to the interface chip by the plurality of electrodes; and wherein the plurality of electrodes are configured to transmit memory access commands.

13. The apparatus of claim 10, wherein the first memory core chip further comprises a fourth memory cell bank group addressed by a third bank address and configured to be accessed in the first channel;

wherein the second memory core chip further comprises a fifth memory cell bank group addressed by a fourth bank address and configured to be accessed in the first channel; and wherein the third memory core chip further comprises a sixth memory cell bank group addressed by the third bank address and configured to be accessed in the second channel.

14. The apparatus of claim 13, wherein the first and third memory core chips are configured to alternately receive first memory access commands including the first bank address and second memory access commands including the third bank each clock cycle on a command signal.

15. The apparatus of claim 14, wherein the first channel comprises:

a first sub channel configured to provide the first memory access command; and a second sub channel configured to provide the second memory access command.

16. An apparatus comprising:

a memory controller configured to provide clock signals, command signals, and data signals via a plurality of channels including a first channel and a second channel;

an interface chip configured to be coupled to the memory controller and configured to receive the clock signals, the command signals and the data signals via the plurality of channels including the first channel and the second channel from the memory controller; and a plurality of memory core chips stacked on the interface chip wherein the plurality of memory core chips and the interface chip are coupled to one another by a plurality of through electrodes, the plurality of memory core chips including:

a first memory core chip including a first memory cell bank group configured to be accessed in a first channel through the plurality of through electrodes;

a second memory core chip adjacent to the first memory core chip and disposed between the first memory core chip and the interface chip, the second memory core chip including a second memory cell bank group configured to be accessed in the first channel through the plurality of through electrodes; and a third memory core chip disposed between the second memory core chip and the interface chip, the third memory core chip including a third memory cell bank group configured to be accessed in a second channel through the plurality of through electrodes;

wherein the first memory core chip and the third memory core chip are configured to be activated for data transfer responsive to a first plurality of commands that are indicative of a first bank address associated with a first memory cell bank group, and wherein the second memory core chip is configured to be activated for data transfer responsive to a second plurality of commands that are indicative of a second bank address associated with a second memory cell bank group that is different from the first memory cell bank group.

17. The apparatus of claim 16, further comprising:

a fourth memory core chip coupled to the plurality of through electrodes, the fourth memory core chip including a fourth memory bank configured to be accessed in the first channel through the plurality of through electrodes, the fourth memory core chip being stacked over the first memory core chip;

a fifth memory core chip coupled to the plurality of through electrodes, the fifth memory core chip including a fifth memory bank configured to be accessed in the first channel through the plurality of through electrodes, the fifth memory core chip being between the second and third memory core chips; and a sixth memory core chip coupled to the plurality of through electrodes, the sixth memory core chip including a sixth memory bank configured to be accessed in the second channel through the plurality of through electrodes, the sixth memory core chip being between the fifth and third memory core chips.

18. The apparatus of claim 16 further comprising:

a fourth memory core chip coupled to the plurality of through electrodes, the fourth memory core chip including a fourth memory bank configured to be accessed in a third channel through the plurality of through electrodes, the fourth memory core chip being stacked over the first memory core chip;

a fifth memory core chip coupled to the plurality of through electrodes, the fifth memory core chip including a fifth memory bank configured to be accessed in the third channel through the plurality of through electrodes, the fifth memory core chip being between the first and second memory core chips; and a sixth memory core chip coupled to the plurality of through electrodes, the sixth memory core chip including a sixth memory bank configured to be accessed in a fourth channel through the plurality of through electrodes, the sixth memory core chip being between the second and third memory core chips, wherein the memory controller is further configured to provide the clock signals, the command signals and the data signals via the plurality of channels including the third channel and the fourth channel, and wherein the interface chip is further configured to receive the clock signals, the command signals and the data signals via the plurality of channels including the third channel and the fourth channel from the memory controller.

19. The apparatus of claim 16, wherein the first memory core chip further comprises a fourth memory cell bank group addressed by a third bank address and configured to be accessed in the first channel;

wherein the second memory core chip further comprises a fifth memory cell bank group addressed by a fourth bank address and configured to be accessed in the first channel, and wherein the third memory core chip further comprises a sixth memory cell bank group addressed by the third bank address and configured to be accessed in the second channel.

20. The apparatus of claim 16, wherein the first memory core chip further comprises a fourth memory cell bank group addressed by a third bank address and configured to be accessed in the first channel;

wherein the second memory core chip further comprises a fifth memory cell bank group addressed by a fourth bank address and configured to be accessed in the first channel, and wherein the third memory core chip further comprises a sixth memory cell bank group addressed by the third bank address and configured to be accessed in the second channel.

21. The semiconductor apparatus of claim 20, wherein the memory controller is configured to alternately provide a command signal including memory access commands including the first bank address and memory access commands including the third bank each clock cycle.

* * * * *